United States Patent
Han

(10) Patent No.: US 9,640,657 B2
(45) Date of Patent: May 2, 2017

(54) SEMICONDUCTOR DEVICE

(71) Applicant: Semiconductor Manufacturing International (Shanghai) Corporation, Shanghai (CN)

(72) Inventor: Qiuhua Han, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/809,896

(22) Filed: Jul. 27, 2015

(65) Prior Publication Data

US 2015/0333179 A1 Nov. 19, 2015

Related U.S. Application Data

(62) Division of application No. 14/069,693, filed on Nov. 1, 2013, now Pat. No. 9,123,812.

(30) Foreign Application Priority Data

Jan. 11, 2013 (CN) .......................... 2013 1 0011741

(51) Int. Cl.
*H01L 29/78* (2006.01)
*H01L 29/165* (2006.01)
*H01L 29/16* (2006.01)
*H01L 29/66* (2006.01)
*H01L 29/10* (2006.01)

(52) U.S. Cl.
CPC ...... *H01L 29/7842* (2013.01); *H01L 29/1054* (2013.01); *H01L 29/165* (2013.01); *H01L 29/1608* (2013.01); *H01L 29/66795* (2013.01); *H01L 29/785* (2013.01); *H01L 29/7855* (2013.01)

(58) Field of Classification Search
CPC ............... H01L 29/7842; H01L 29/165; H01L 29/1608; H01L 29/1054
USPC ......................................................... 257/365
See application file for complete search history.

(56) References Cited

U.S. PATENT DOCUMENTS

| 6,855,982 | B1 | 2/2005 | Xiang et al. |
| 7,033,869 | B1 | 4/2006 | Xiang et al. |
| 7,915,112 | B2 | 3/2011 | Xu et al. |
| 2009/0101982 | A1 | 4/2009 | Nagatomo |
| 2012/0104509 | A1 | 5/2012 | Matsumoto |
| 2013/0065371 | A1* | 3/2013 | Wei ............ H01L 21/76224 438/294 |

* cited by examiner

*Primary Examiner* — Julia Slutsker
*Assistant Examiner* — Dmitriy Yemelyanov
(74) *Attorney, Agent, or Firm* — Anova Law Group, PLLC

(57) ABSTRACT

Semiconductor devices and fabrication methods are provided. In an exemplary method, a semiconductor layer including a first opening can be provided. The first opening can be filled with a stress material. The stress material can then be etched to form a second opening having a width less than a width of the first opening to leave a stress material layer in the semiconductor layer and on each sidewall of the second opening. The semiconductor layer can be etched to form a fin structure on a sidewall surface of the stress material layer. A main gate structure can be formed on the sidewall surface of the fin structure. A back gate structure can be formed on the sidewall surface of the stress material layer.

19 Claims, 4 Drawing Sheets

SEMICONDUCTOR DEVICE

CROSS REFERENCE TO RELATED APPLICATIONS

This application is a divisional of U.S. patent application Ser. No. 14/069,693, filed on Nov. 1, 2013, which claims priority to Chinese Patent Application No. CN201310011741.5, filed on Jan. 11, 2013, all of which are incorporated herein by reference in their entirety.

FIELD OF THE DISCLOSURE

The present disclosure generally relates to the field of semiconductor manufacturing technology and, more particularly, relates to semiconductor devices having double gates and methods for making the semiconductor devices.

BACKGROUND

With advances of semiconductor process technology and the decreasing of process node, metal gate process is widely applied to achieve ideal threshold voltage and to improve device performance. However, as the critical dimension of device further shrinks, the structure of conventional MOS field effect transistor (FET) cannot meet requirements for device performance even if the metal gate process is utilized. Thus multiple gate devices as a substitute for conventional devices are drawing wide attention.

Fin FET is a common multiple gate device. FIG. 1 illustrates a three-dimensional schematic for a conventional fin FET. As shown in FIG. 1, a fin FET includes a semiconductor substrate 10, a fin 14 formed on the substrate 10 by etching the substrate 10, a dielectric layer 11 formed on the surface of semiconductor 10 and a portion of sidewall of the fin 14, and a gate structure 12 formed across the fin 14 over the top and sidewall of the fin 14. The gate structure 12 includes a gate dielectric layer (not shown) and a gate electrode (not shown) formed on the gate dielectric layer. In such a fin FET, the top area of the fin 14 and contact area between the sidewalls of fin 14 and the gate structure 12 form channel regions (e.g., provide multiple gates) to increase the driving current to improve the device performance.

A conventional method for improving device performance of the fin FET include enhancing carrier mobility in the channel regions by adjusting stress in the channel regions using strained silicon technique. A fin FET having enhanced carrier mobility in the channel regions is formed by forming a high-k dielectric layer followed by forming a stress metal layer on the surface of the high-k dielectric layer and forming metal gate electrodes on the surface of stress metal layer. As a result, stretching or compressing of the crystal lattice in the channel regions of fin FET by the stress metal layer can enhance the carrier mobility in the channel regions.

However, the stress metal layer needs to use the high-k gate dielectric layer to stretch or compress the crystal lattice in the channel regions of the fin FET, electrical properties of the high-k gate dielectric layer can be affected. This can result in more defects formed in the high-k gate dielectric layer with increased gate leakage current and decreased gate breakdown voltage.

BRIEF SUMMARY OF THE DISCLOSURE

One aspect of the present disclosure includes a method of fabricating an semiconductor device. A semiconductor layer including a first opening therein can be provided. The first opening can be filled with a stress material. The stress material can then be etched to form a second opening having a width less than a width of the first opening to leave a stress material layer in the semiconductor layer and on each sidewall of the second opening. The semiconductor layer can be etched to form a fin structure on a sidewall surface of the stress material layer. A main gate structure can be formed on the sidewall surface of the fin structure. A back gate structure can be formed on the sidewall surface of the stress material layer.

Another aspect of the present disclosure includes a semiconductor device. The semiconductor device can include a semiconductor layer, a fin structure on the semiconductor layer, a stress material layer having a first sidewall disposed on a first sidewall surface of the fin structure. The semiconductor device can also include a main gate structure disposed on a second sidewall surface of the fin structure. The first sidewall surface of the fin structure is opposite to the second sidewall surface of the fin structure. The semiconductor device can further include a back gate structure disposed on a second sidewall surface of the stress material layer. The stress material layer is disposed between the fin structure and the back gate structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

To improve the device performance of fin FET, carrier mobility in a channel region may be enhanced. However, conventional methods for enhancing carrier mobility in the channel region can affect the electrical properties of a high-k gate dielectric layer of the fin FET.

Disclosed herein includes a semiconductor structure and a fabrication method for making the same. The semiconductor structure includes a semiconductor substrate, a fin structure on the semiconductor structure, a main gate structure on one sidewall of the fin structure, a stress material layer on the other sidewall of the fin structure, and a back gate structure on the sidewalls of the stress material layer located between the fin structure and the back gate structure. The formed semiconductor structure is a double gate structure, and the sidewall of the fin structure close to the main gate structure can be used as a channel region. The stress material layer is located between the fin structure and the back gate structure and provides a uniform stress to the channel region to enhance carrier mobility in the channel region. With the fin structure disposed between the stress material layer and the main gate structure, the stress material layer can exert a smaller stress to the gate dielectric layer of the main gate structure, thus not affect the electrical properties of the gate dielectric layer.

FIGS. 2-11 depict an exemplary method for fabricating a semiconductor device in accordance with various disclosed embodiments.

Figure 1:
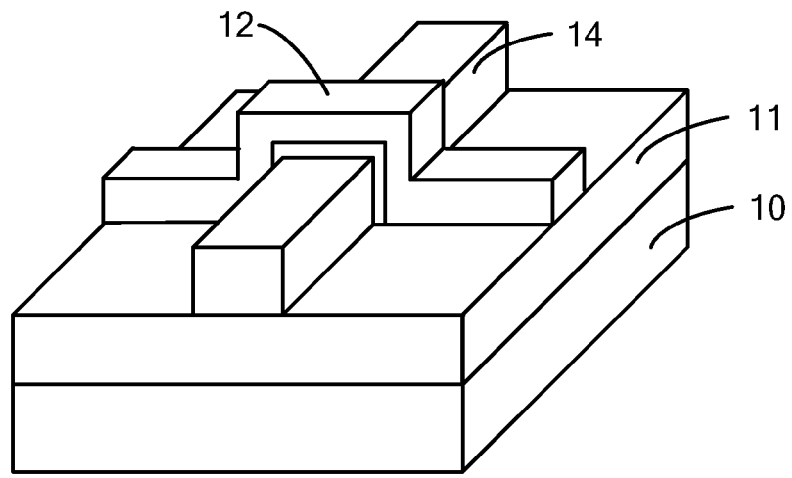
FIG. 1 depicts a schematic for a conventional fin FET structure.
Figure 2:
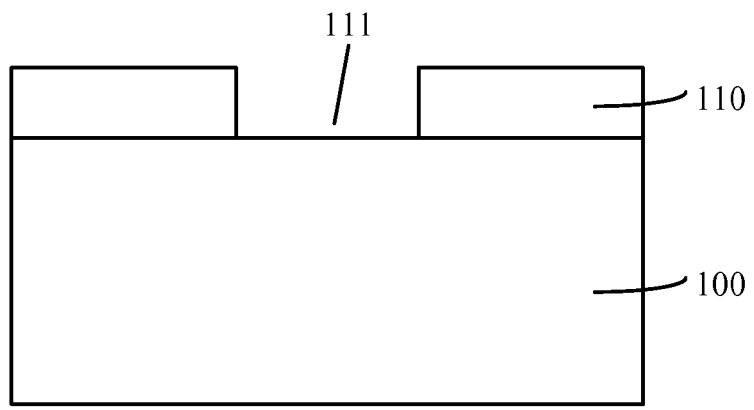
FIGS. 2-11 are schematics for an exemplary method for forming a semiconductor device in accordance with various disclosed embodiments.

As shown in FIG. 2, a semiconductor layer 100 is provided. A first mask layer 110 having a third opening 111 is formed on the semiconductor layer 100.

In this exemplary embodiment, the semiconductor layer can be made of silicon. In other embodiments, the semiconductor layer can be made of germanium, a silicon layer of a SOI (silicon on insulator), or a germanium layer of a GeOI (germanium on insulator). The SOI (silicon on insulator) includes an insulating layer sandwiched by a top silicon layer and a bottom silicon layer. The GeOI (germanium on insulator) includes an insulating layer sandwiched by a top germanium layer and a bottom germanium layer. In some cases, the semiconductor layer may include a germanium layer on an insulating layer, which is on a bottom silicon layer. The semiconductor substrate can then be etched to form a fin structure.

The first mask layer 110 may be formed of photoresist, silicon oxide, silicon nitride, silicon oxynitride, amorphous carbon or polymer. In this exemplary embodiment, the first mask layer 110 is made of silicon nitride, and the thickness of the first mask layer 110 is greater than the width of the fin structure to be subsequently formed. The width of the third opening 111 corresponds to the width of a first opening to be formed subsequently, and also corresponds to the space between the two subsequently formed neighboring fin structures.

Figure 3:
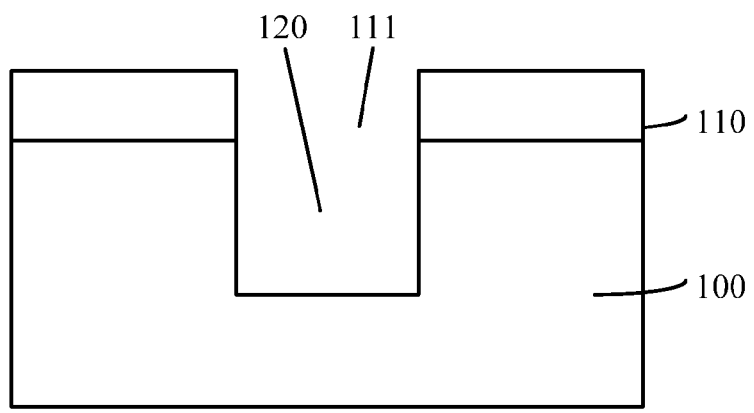

In FIG. 3, using the first mask layer 110 as an etch mask, a first opening 120 can be formed by etching the exposed semiconductor layer 100. In this exemplary embodiment, the etching for forming the first opening 120 includes a dry etching process. In other embodiments, following the formation of the first opening 120, a wet etching process can be conducted to the sidewalls of the first opening 120 to smooth the sidewall surfaces of the first opening 120. This can reduce crystal lattice defects between the subsequently formed fin structure and a stress material layer to increase the stress applied to the fin structure by the stress material layer.

In this exemplary embodiment, the first opening 120 has a width ranging from about 10 nm to about 100 nm, and a depth ranging from about 10 nm to about 100 nm. In other embodiments, when the semiconductor layer is formed of a top silicon layer of an SOI, or a top germanium layer of a GeOI, the first opening 120 has a depth less than or equal to a thickness of the semiconductor layer.

Figure 4:
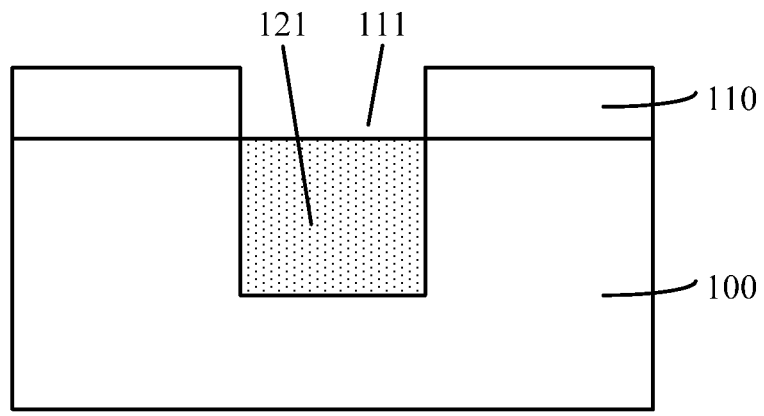

Referring to FIG. 4, stress material 121 is filled in the first opening 120 in the semiconductor layer. In this embodiment, formation of the stress material 121 is achieved by a selective epitaxy, e.g., at a reaction temperature of about 500° C. to about 800° C. and a gas pressure of about 1 torr to about 100 torr, and having a silicon source gas ($SiH_4$ and/or $SiH_2C_{12}$) with a flow rate of about 1 sccm to about 1000 sccm, a germanium source gas ($GeH_4$) with a flow rate of about 1 sccm to about 1000 sccm, and/or a carbon source gas ($CH_4$, $CH_3Cl$, and/or $CH_2Cl_2$) with a flow rate of about 1 sccm to about 1000 sccm. Gases for the selective epitaxy further include HCl with a flow rate of about 1 sccm to about 1000 sccm, and/or $H_2$ with a flow rate of about 0.1 sccm to about 50 sccm. The stress material 121 has a thickness equal to the depth of the first opening 120, e.g., having a top surface of the stress material 121 leveled with a top surface of the substrate layer (or a top surface of a fin structure to be formed). In other embodiments, chemical vapor deposition can be used to form the stress material.

In some embodiments when forming an NMOS transistor, the corresponding stress material includes germanium-silicon. Because the crystal lattice constant of germanium-silicon is greater than the crystal lattice constant of bulk silicon, the formed stress material layer can produce tensile stress exerted to the fin structure to enlarge the crystal lattice constant of the fin structure and thus enhance electron mobility. Further, because electron is the current carrier in the channel region of NMOS transistor, carrier mobility in the channel region of NMOS transistor can be enhanced to improve electrical properties of the NMOS transistor.

In other embodiments when forming a PMOS transistor, the corresponding stress material includes silicon carbide. Because the crystal lattice constant of silicon carbide is smaller than the crystal lattice constant of bulk silicon, the formed stress material layer can produce compressive stress exerted to the fin structure to decrease the crystal lattice constant of the fin structure and thus to enhance hole mobility. Further, because hole is the current carrier in the channel region of PMOS transistor, carrier mobility in the channel region of PMOS transistor can be enhanced to improve electrical properties of the PMOS transistor.

Figure 5:
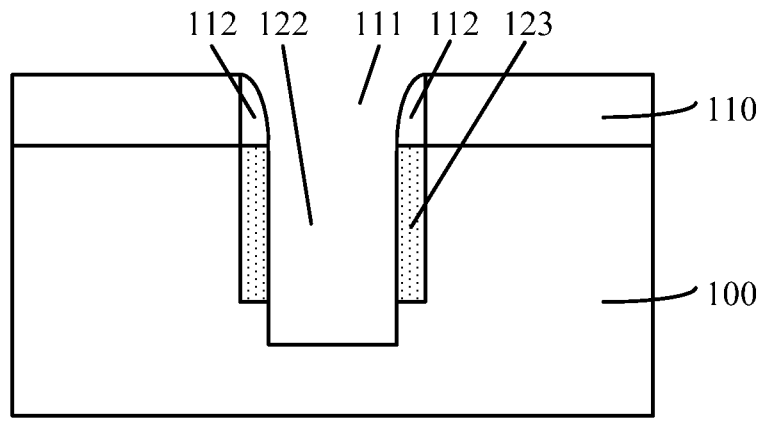

In FIG. 5, sidewall spacers 112 are formed on the sidewall of the third opening 111 of the first mask layer 110 (and on the stress material 121). The stress material 121 is then etched using the sidewall spacers 112 and the first mask layer 110 as an etch mask to form a second opening 122 in the stress material 121 and further into the semiconductor layer 100.

The process for forming the sidewall spacers 112 include forming one or multiple layers of sidewall material (silicon oxide, silicon carbide, and/or silicon oxynitride) on the surface of both the first mask layer 110 and on the stress material 121. The sidewall material layer is then etched back without using mask to expose the surface of both the first mask layer 110 and the stress material 121. The sidewall spacers 112 are then formed on the sidewall of the third opening 111 of the first mask layer 110. The sidewall spacers 112 can be made of the same or different material with the first mask layer 110. In an exemplary embodiment, the sidewall spacers 112 and the first mask layer 110 are formed of the same material (silicon nitride). The sidewall spacers 112 can be subsequently removed during the process of etching the first mask layer 110. The width of sidewall spacers 112 can be adjusted by an etching angle, etching rate, etching power, and etching gas, such that the resulting sidewall width can be much smaller than the critical dimension of conventional photolithography. In this manner, the sidewall spacers 112 can be formed with reduced dimensions (e.g., width).

The subsequent etching of the stress material 121 can be performed by utilizing the sidewall spacers 112 as self-aligned hard mask, no photolithography and/or other alignment techniques are needed. This can simplify manufacturing process and improve the dimension (e.g., width) accuracy for subsequently forming a stress material layer.

Etching the stress material 121 is accomplished by an anisotropic dry etching. Such etching process employs the sidewall spacers 112 as mask to form the stress material layer 123, thus the width of sidewall spacers 112 correspond to the width of the stress material layer 123, as shown in FIG. 5. Accordingly, the stress material layer 123 with a significant small width can be formed by controlling the width of the sidewall spacers 112. In this manner, device size is controllably decreased and degree of integration is increased. Further, the threshold voltage of MOS transistor can be fine tuned by controlling the width of stress material layer 123. In one embodiment, the width of stress material layer 123 (i.e., same as a width of the sidewall spacer) ranges from 5 nm to 15 nm.

In an exemplary embodiment, the depth of the second opening 122 formed by the dry etching process is greater than the depth of the first opening 120. Since a dielectric material layer is to be deposited subsequently on the bottom surface of the second opening 122 to separate the main gate structure and the back gate structure from the semiconductor layer 100, controlling the depth of the second opening 122 and the thickness of the subsequently formed dielectric material layer can allow the top surface of the dielectric material layer to be leveled with or higher than the bottom surface of the stress material layer 123, causing the subsequently formed back gate structure to be totally located on the sidewall surface of the stress material layer. The back gate structure has a same total height with the main gate structure, thus the total height of the stress material layer 123 is greater than or equal to the total height of the main gate structure. The stress material layer 123 exerts uniform stress to the channel regions corresponding to the main gate structures with different heights, leading to the improvement of carrier mobility.

In other embodiments, the depth of the second opening 122 formed by the dry etching process can be less than or equal to the depth of the first opening. When the semiconductor layer is formed of either a top silicon layer of a silicon-on-insulator (SOI) substrate or a top germanium layer of a germanium-on-insulator (GeOI) substrate, and also the depth of the first opening 120 is equal to the thickness of the semiconductor layer, the depth of the second opening 122 formed by the dry etching process is equal to the depth of the first opening.

In other embodiments, a patterned photoresist layer can be used as mask to etch the stress material 121 in the first opening 120 to form the second opening 122. The width of the second opening 122 is smaller than the width of the first opening 120, so the stress material layer can be formed on at least one sidewall of the second opening 122, and the semiconductor layer being in contact with the stress material layer is subsequently used to form the fin structure.

Figure 6:
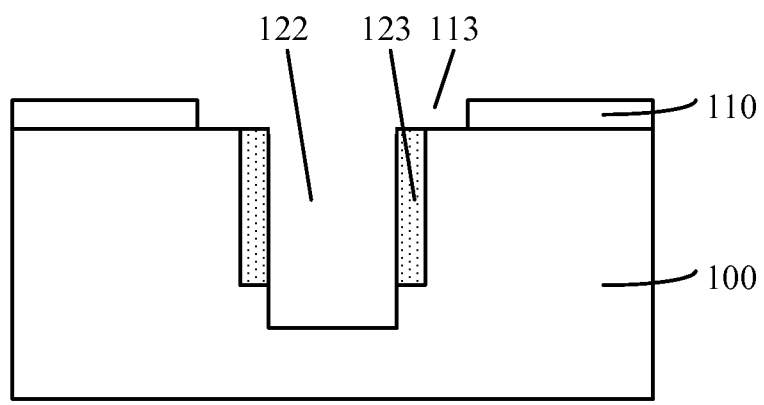

Referring to FIG. 6, the sidewall spacers 112 are removed. A fourth opening 113 with a width greater than the first opening 111 is formed in the first mask layer 110 by further etching sidewalls of the third opening 111. In an exemplary embodiment, the same wet etching process is employed to remove the sidewall spacers 112 and the first mask layer 110 because both the sidewall spacers 112 and the first mask layer 110 may be formed of silicon nitride.

After removal of the sidewall spacers 112 and while the sidewall of the third opening 111 of the first mask layer 110 is etched, a top portion of the first mask layer 110 is also removed by a corresponding thickness portion due to the isotropic characteristics of the wet etching process.

The fourth opening 113 formed by etching the sidewall of the third opening 111 of the first mask layer 110 has a width corresponding to the exposed width of the underlying semiconductor layer 100 and corresponding to a width of the subsequently formed fin structure. Therefore, the thickness of the first mask layer 110 should be greater than the width of the fin structure such that, after the fourth opening 113 with a larger width is formed, a remaining portion of the first mask layer can still have a remaining thickness and can be used as a second mask layer in subsequent process.

Because of the slow etching rate of the wet etching process, the width to be etched on the sidewalls of the third opening 111 in the first mask layer 110 can be accurately controlled such that the width of subsequently formed fin structure can be accurately controlled to provide the formed fin structure with a significant small width. Degree of device integration can be improved. Due to the self-alignment for the wet etching process, no photolithography and alignment techniques are required for the etching, which simplifies manufacturing process and improves width accuracy of the subsequently formed fin structure.

The formed transistor can be a double gate fin FET. A narrow fin structure can facilitate use of back gate structure to adjust the threshold voltage of the double gate fin FET and facilitate use of stress material layer to exert the stress to the channel region. In one embodiment, the width to be etched for the first mask layer 110 on the sidewalls of the third opening 111 ranges from 5 nm to 30 nm. Accordingly, the width of the subsequently formed fin structure ranges from 5 nm to 30 nm.

In other embodiments, when the sidewall is formed of a material different from the material of the first mask layer, the sidewall can be first removed using a wet etching process, then the portion of the first mask layer for the sidewall of the third opening is removed using either a wet etching process or a dry etching process. In other embodiments, patterned photoresist can be used as an etch mask to etch into the sidewall of the first opening to remove a width portion of the first mask layer to form a fourth opening. The fourth opening exposes a surface portion of the semiconductor layer paralleled with the stress material layer.

Figure 7:
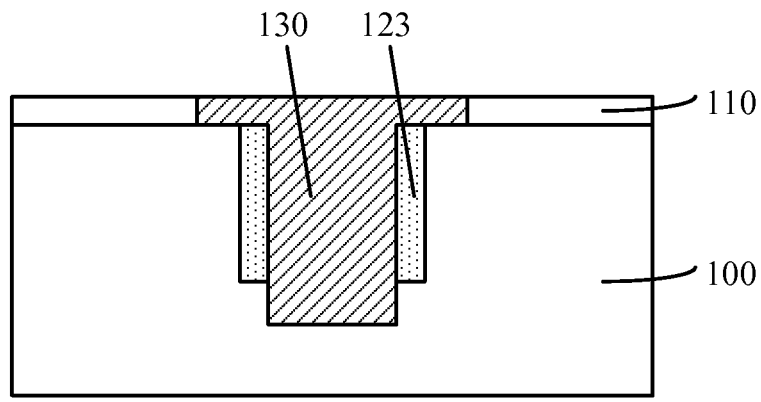

Referring to FIG. 7, a second mask layer 130 is formed in the second opening 122 and the fourth opening 113. The process for forming the second mask layer 130 includes forming a second mask material (not shown) by a chemical vapor deposition on the surface of the first mask layer 110 and in the second opening 122 and the fourth opening 113; performing a chemical mechanical polishing on the second mask material; and forming the second mask layer 130 in the second opening 122 and the fourth opening 113 by employing the first mask layer 110 as polishing stop layer.

Since the second mask layer 130 is formed of a material different from the material for the first mask layer 110, no damage is caused to the second mask layer 130 when the first mask layer 110 is removed subsequently using a wet etching technique. The second mask layer 130 can be formed of silicon nitride, silicon oxide, silicon oxynitride, amorphous carbon, and/or polymer. In one embodiment, silicon oxide may be used to form the second mask layer 130. For the subsequent etching of the semiconductor layer 100, the second mask layer 130 can be a self-aligned mask, thus no photolithography and alignment technique are required for etching the semiconductor layer 100. This can simplify manufacturing process and improve control of width accuracy of the subsequently formed fin structure.

Figure 8:
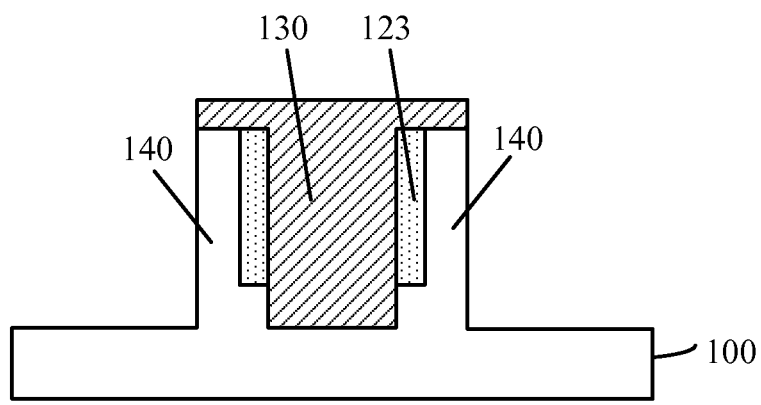

Referring to FIG. 8, the first mask layer 110 is removed. The semiconductor layer 100 is etched to remove a portion thereof utilizing the second mask layer 130 as an etch mask. A fin structure 140 is formed on a sidewall surface of the stress material layer 123.

A wet etching process is employed to remove the first mask layer 100. This etching process does not affect (e.g., damage) the second mask layer 130 if a suitable etching solution is selected for removing the first mask layer 100, due to different constituted materials for the first mask layer 110 and the second mask layer 130. The etching depth of the semiconductor layer 100 is the same as the depth of the second opening 122, such that the contact area between the subsequently formed main gate structure and the fin is the same as the contact area between the back gate structure and the stress material layer. This can thus effectively adjust the threshold voltage of the double gate fin FET utilizing the back gate structure.

In other embodiments, the second mask layer may not be formed. For example, after removal of the first mask layer, a patterned photoresist layer can be formed on the surface of the semiconductor layer covering a certain area of the semiconductor layer adjacent to the stress material layer. The semiconductor substrate can be etched using the patterned photoresist layer as mask to form a fin structure on a sidewall of the stress material layer. The width of the exposed semiconductor layer corresponds to the width of the fin structure.

Figure 9:
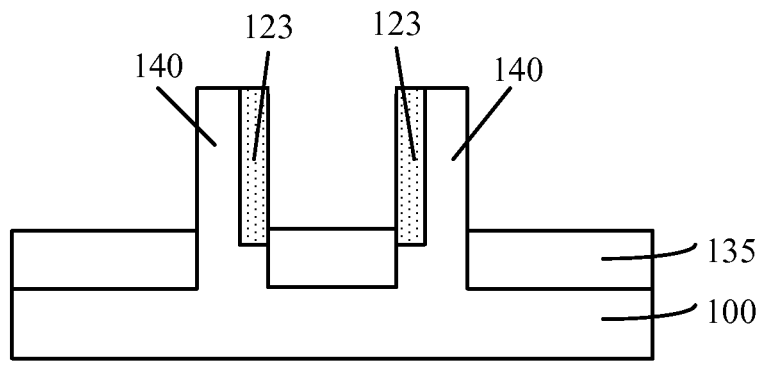

As shown in FIG. 9, a dielectric material layer 135 is deposited on the surface of the semiconductor layer 100. When the semiconductor layer is formed of bulk silicon or bulk germanium, a dielectric material layer is required to be deposited between the semiconductor layer 100 and the main gate structure, and between the semiconductor layer 100 and the back gate structure to prevent the subsequently formed main gate structure and back gate structure from connecting to the semiconductor layer 100. Therefore, the dielectric material layer 135 needs to be formed on the surface of the semiconductor layer 100 prior to the formation of main gate structure and back gate structure. In other embodiments, when the semiconductor layer is a top silicon layer of silicon-on-insulator substrate or a top germanium layer of the germanium-on-insulator substrate, the dielectric material layer is not required due to the insulating material contained in the silicon-on-insulator substrate or the germanium-on-insulator substrate.

In one embodiment, the dielectric material layer 135 is formed of silicon oxide. The process for forming the dielectric material layer 135 includes forming silicon oxide with a thickness greater than the depth of the second opening on the surface of semiconductor layer 100 and the surface of the second mask layer 130; polishing the silicon oxide using chemical mechanical polishing to expose the stress material layer 123 and expose the top surface of the fin structure 140; etching back the silicon oxide on the stress material layer 123 and the both sides of fin structure 140; and forming the dielectric material layer 135 with a uniform thickness on the surface of semiconductor layer 100.

The height of the ultimately exposed fin structure can be controlled by adjusting the thickness of the dielectric material layer 135. The sidewall of the ultimately exposed fin structure corresponds to the channel region of the MOS transistor. In this manner, the section plane area can be controlled and, accordingly, the driving current for the MOS transistor can be controlled. When the height of the exposed fin structure 140 is less than (as shown in FIG. 9) or equal to the height of the stress material layer 123, channel regions with different heights can receive the same stress to enhance the carrier mobility.

In other embodiments, the process for forming the dielectric material layer 135 can include removing first the second mask layer and then forming a silicon oxide layer with a thickness greater than the depth of the second opening on the surface of semiconductor layer, the stress material layer, and the surface of the fin structure; polishing the silicon oxide using chemical mechanical polishing to expose the stress material layer and the top surface of the fin structure; etching back the silicon oxide layer on the stress material layer and the both sides of fin structure; and forming the dielectric material layer with a uniform thickness on the surface of semiconductor layer.

In other embodiments, the process for forming the dielectric material layer 135 can include removing first the second mask layer and then forming a silicon oxide layer on the surface of semiconductor substrate, the stress material layer, and the surface of the fin structure; etching back locally the silicon oxide layer on the stress material layer and the top surface and portion of sidewall surface of fin structure; and forming the dielectric material layer with a uniform thickness on the surface of semiconductor layer.

Figure 10:
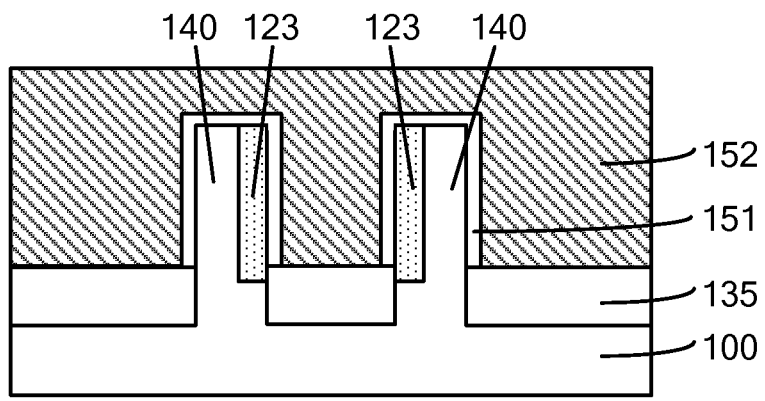

Referring to FIG. 10, a gate dielectric layer 151 is formed on each surface of the dielectric layer 135, the stress material layer 123, and the fin structure 140. A gate electrode 152 is formed on the surface of the gate dielectric layer 151. The gate dielectric layer can be formed of silicon oxide and/or high-k gate dielectric material (e.g., hafnium oxide, zirconium oxide, lanthanum oxide, titanium oxide, tantalum oxide, aluminum oxide, hafnium silicon oxide, zirconium silicon oxide, barium strontium titanium oxide, barium titanium oxide, and/or strontium titanium oxide).

When the gate dielectric layer 151 is formed of silicon oxide, a corresponding gate electrode 152 can be made of polysilicon. When the gate dielectric layer 151 is formed of a high-k gate dielectric material, a corresponding gate electrode 152 can be made of metal that is accomplished by front gate or back gate process.

In one embodiment, the gate dielectric layer 151 is formed of silicon oxide with a thickness ranging from 0.5 nm to 5 nm, and the corresponding gate electrode 152 is made of polysilicon with a thickness ranging from 10 nm to 100 nm. The thickness of both the gate dielectric layer 151 and the gate electrode 152 is greater than the height of the exposed fin structure. Source regions and drain regions (not shown) are formed inside the stress material layer 123 and the fin structure 140 on both sides of the gate dielectric layer 151 and gate electrode 152, e.g., by an ion implantation or an in-situ doping process.

Figure 11:
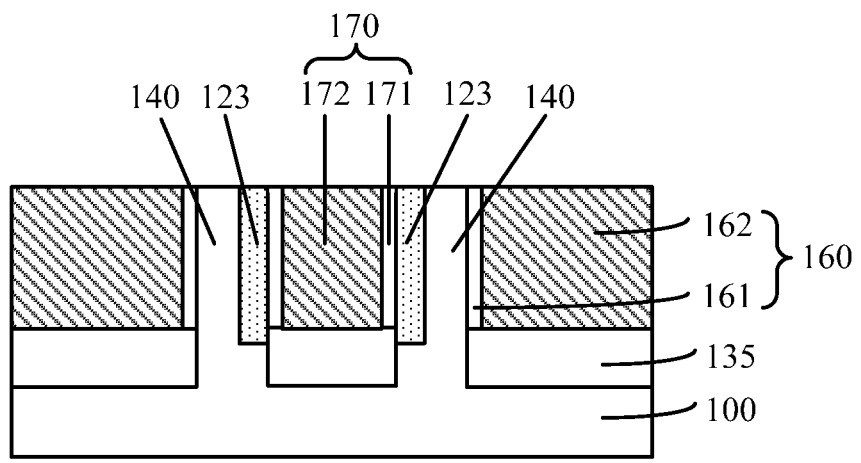

As shown in FIG. 11, the gate dielectric layer 151 and the gate electrode 152 located on the top surface of the stress material layer 123 and the fin structure 140 are removed. A main gate structure 160 is formed on the sidewall surface of the fin structure 140. A back gate structure 170 is formed on the sidewall surface of the stress material layer 127.

In an exemplary embodiment, the formed semiconductor structure is a double gate fin FET including a main gate structure 160 located on a sidewall surface of the fin structure 140 and a back gate structure 170 located on a sidewall surface of the stress material layer 123. The main gate structure 160 provides a work voltage to the transistor, and the sidewall region of the fin structure 140 contacting the main gate structure 160 forms a channel region. The threshold voltage between the main gate structure 160 and the drain can be adjusted by controlling the voltage applied to the back gate structure.

For NMOS transistor, the threshold voltage between the main gate structure 160 and the drain increases accordingly as a voltage applied to the back gate structure increases. Accordingly, the threshold voltage between the main gate structure 160 and the drain decreases as a voltage applied to the back gate structure decreases. For PMOS transistor, the threshold voltage between the main gate structure 160 and the drain decreases accordingly while a voltage applied to the back gate structure increases. Accordingly, the threshold voltage between the main gate structure 160 and the drain increases while a voltage applied to the back gate structure decreases.

In an embodiment, the main gate structure 160 includes the first gate dielectric layer 161 formed on the sidewall surface of the fin structure 140 (that is positioned opposite to the stress material layer 123) and the first gate electrode 162 formed on the first gate dielectric layer 161. The back gate structure 170 includes the second gate dielectric layer 171 formed on the sidewall surface of stress material layer 123 (that is opposite to the fin structure 140) and the second gate electrode 172 on the second gate dielectric layer 171.

The process for forming the main gate structure 160 and the back gate structure 170 includes polishing the gate dielectric layer 151 and the gate electrode 152 using chemical mechanical polishing until the stress material layer 123 and the top surface of fin structure 140 are exposed, because the height of gate dielectric layer 151 and gate electrode 152 is greater than the height of the exposed fin structure. The main gate structure 160 can be formed on the sidewall surface of fin structure 140. The back gate structure 170 can be formed on the sidewall surface of stress material layer 123.

In other embodiments, after formation of the gate dielectric layer and the gate electrode, local etching back can be conducted to the gate dielectric layer and the gate electrode on the stress material layer and the top surface of fin structure until the stress material layer and the top surface of fin structure are exposed. The main gate structure is formed on the sidewall surface of fin structure, and the back gate structure is formed on the sidewall surface of stress material layer.

Referring to FIG. 11, a semiconductor structure is provided including a semiconductor layer 100, a fin structure 140 on the surface of the semiconductor layer 100, a stress material layer 123 on a sidewall surface of the fin structure 140, a dielectric layer 135 located on the surface of the semiconductor layer 100 as well as on the both sides of the stress material layer 123 and the fin structure 140, a main gate structure on the surface of the dielectric layer 135 as well as on the other sidewall surface of the fin structure 140, and a back gate structure 170 on the surface of the dielectric layer 135 as well as on the other sidewall surface of the stress material layer 123 that is located between the fin structure 140 and the back gate structure 170.

In some embodiments, the semiconductor layer is formed of bulk silicon. In other embodiments, the semiconductor layer can be formed of bulk germanium, a top silicon layer of a silicon-on-insulator substrate, or a top germanium layer of a germanium-on-insulator substrate. The width of stress material layer 123 ranges from 5 nm to 15 nm. The width of fin structure 140 ranges from 5 nm to 30 nm. When the semiconductor structure is an NMOS transistor, the stress material layer 123 is formed of germanium-silicon; and when the semiconductor structure is a PMOS transistor, the stress material layer 123 is formed of silicon carbide.

The formed semiconductor structure is a double gate structure, and the sidewall of fin structure 140 close to the main gate structure 160 can act as a channel region. The stress material layer 123 is located between the fin structure 140 and the back gate structure 170 and provides a uniform stress to the channel region to enhance carrier mobility in the channel region. With the fin structure 140 disposed between the stress material layer 123 and the main gate structure 160, the stress material layer 123 can exert a smaller stress to the gate dielectric layer of the main gate structure 160, thus not to affect electrical properties of the gate dielectric layer.

Other applications, advantages, alternations, modifications, or equivalents to the disclosed embodiments are obvious to those skilled in the art.

What is claimed is:

1. A semiconductor device comprising:
a semiconductor layer;
a fin structure on the semiconductor layer;
a stress material layer disposed over the semiconductor layer and having a first sidewall disposed on a first sidewall surface of the fin structure;
a main gate structure disposed on a second sidewall surface of the fin structure, wherein the first sidewall surface of the fin structure is opposite to the second sidewall surface of the fin structure; and
a back gate structure disposed on a second sidewall surface of the stress material layer, wherein the stress material layer is disposed between the fin structure and the back gate structure, the stress material layer and the fin structure have a coplanar top surface.

2. The device of claim 1, wherein the stress material layer has a width ranging from about 5 nm to about 15 nm.

3. The device of claim 1, wherein the fin structure has a width ranging from about 5 nm to about 30 nm.

4. The device of claim 1, wherein the stress material layer is formed of silicon carbide when the semiconductor device is a PMOS transistor and the stress material layer is formed of germanium-silicon when the semiconductor device is an NMOS transistor.

5. The device of claim 1, further including a source region and a drain region disposed in the fin structure at both sides of each of the main gate structure and the back gate structure.

6. The device of claim 1, wherein the semiconductor layer includes a bulk silicon, a bulk germanium, a top silicon layer of a silicon-on-insulator substrate, or a top germanium layer of a germanium-on-insulator substrate.

7. The device of claim 1, wherein the semiconductor layer is a bulk silicon or a bulk germanium, and wherein a dielectric layer is disposed between the semiconductor layer and each of the main gate structure and the back gate structure.

8. The device of claim 7, wherein:
the main gate structure includes a first gate dielectric layer and a first gate electrode, and
each of the first gate dielectric layer and the first gate electrode is disposed on the dielectric layer.

9. The device of claim 7, wherein:
the back gate structure includes a second gate dielectric layer and a second gate electrode, and
each of the second gate dielectric layer and the second gate electrode is disposed on the dielectric layer.

10. The device of claim 7, wherein:
a portion of the second sidewall surface of the stress material layer is on a sidewall of a portion of the dielectric layer.

11. The device of claim 1, wherein:
the stress material layer, the back gate structure, and the main gate structure have a coplanar top surface.

12. The device of claim 1, wherein:
the stress material layer, each of a first gate dielectric layer and a first gate electrode of the main gate structure, and each of a second gate dielectric layer and a second gate electrode of the back gate structure have a coplanar top surface.

13. The device of claim 1, wherein:
the stress material layer has a bottom surface situating on a portion of the fin structure.

14. A semiconductor device comprising:
a semiconductor layer;
a plurality of fin structures on the semiconductor layer;
a back gate structure disposed over the semiconductor layer and between a first fin structure and a second fin structure;
a first stress layer disposed over the semiconductor layer and between the first fin structure and the back gate structure;
a first main gate structure disposed on a sidewall surface of the first fin structure away from the first stress layer;
a second stress layer disposed over the semiconductor layer and between the back gate structure and the second fin structure; and
a second main gate structure disposed on a sidewall surface of the second fin structure away from the second stress layer.

15. The device of claim 14, further including:
a dielectric material layer disposed between the semiconductor layer and each of the first and second main gate structures and the back gate structure.

16. The device of claim 14, wherein:
the first and second stress material layers and the fin structure have a coplanar top surface.

17. The device of claim 14, wherein:
the first and second stress material layers, the back gate structure, and the main gate structure have a coplanar top surface.

18. The device of claim 14, wherein:
the first and second stress material layers, a first gate dielectric layer and a first gate electrode of the main gate structure, and a second gate dielectric layer and a second gate electrode of the back gate structure, have a coplanar top surface.

19. The device of claim 14, wherein:
each of the first and second stress material layers has a bottom surface situating on a portion of the fin structure.

* * * * *